(12) United States Patent
Owejan et al.

(10) Patent No.: US 12,424,640 B2
(45) Date of Patent: Sep. 23, 2025

(54) FUEL CELL INFORMATION MONITOR AND DATA TRANSFER

(71) Applicant: Plug Power Inc., Latham, NY (US)

(72) Inventors: Jon Owejan, Latham, NY (US); Edward Snyder, Latham, NY (US); Glenn White, Latham, NY (US)

(73) Assignee: PLUG POWER INC., Slingerlands, NY (US)

( * ) Notice: Subject to any disclaimer, the term of this patent is extended or adjusted under 35 U.S.C. 154(b) by 582 days.

(21) Appl. No.: 17/817,400

(22) Filed: Aug. 4, 2022

(65) Prior Publication Data

US 2024/0047708 A1 Feb. 8, 2024

(51) Int. Cl.
| | | |
|---|---|---|
| H01M 8/026 | (2016.01) | |
| G01R 31/371 | (2019.01) | |
| G01R 31/378 | (2019.01) | |
| G01R 31/3835 | (2019.01) | |
| H01M 8/0202 | (2016.01) | |
| H01M 8/1004 | (2016.01) | |
| H01M 8/2418 | (2016.01) | |

(52) U.S. Cl.
CPC ........ *H01M 8/0269* (2013.01); *G01R 31/371* (2019.01); *G01R 31/378* (2019.01); *G01R 31/3835* (2019.01); *H01M 8/1004* (2013.01); *H01M 8/2418* (2016.02)

(58) Field of Classification Search
CPC ............. H01M 8/0269; H01M 8/2418; H01M 8/1004; G01R 31/3835; G01R 31/378; G01R 31/371

USPC .......................................................... 429/400
See application file for complete search history.

(56) References Cited

U.S. PATENT DOCUMENTS

| | | |
|---|---|---|
| 5,252,410 A | 10/1993 | Wilkinson et al. |
| 6,566,004 B1 | 5/2003 | Fly et al. |
| 7,687,174 B2 | 3/2010 | Skala et al. |
| 2012/0003568 A1 | 1/2012 | Schrooten et al. |
| 2015/0030957 A1 | 1/2015 | Van Boeyen et al. |
| 2015/0228988 A1 | 8/2015 | Andreas-Schott |
| 2015/0255806 A1 | 9/2015 | Horlock |
| 2017/0288351 A1 | 10/2017 | Hood |
| 2021/0202968 A1 | 7/2021 | Daly et al. |
| 2022/0167275 A1* | 5/2022 | Suzuki ............... G01R 31/3835 |

FOREIGN PATENT DOCUMENTS

| | | |
|---|---|---|
| DE | 102016121614 | 5/2018 |
| JP | 2008535165 | 8/2008 |
| JP | 2009522753 A | 6/2009 |

(Continued)

OTHER PUBLICATIONS

International Search Report dated Nov. 22, 2023, 3 pp.

(Continued)

*Primary Examiner* — James M Erwin
(74) *Attorney, Agent, or Firm* — Heslin Rothenberg Farley & Mesiti P.C.; Victor A. Cardona, Esq.

(57) ABSTRACT

A fuel cell includes a membrane electrode assembly, a first plate separator and a second plate separator on opposite sides of the membrane electrode assembly and a voltage sensor for detecting a cell voltage relative to opposite sides of the membrane electrode assembly. A transmitter is coupled to the sensor and configured to wirelessly transmit an indication of the cell voltage.

25 Claims, 21 Drawing Sheets

(56) References Cited

FOREIGN PATENT DOCUMENTS

| | | | |
|---|---|---|---|
| JP | 2011165589 | | 8/2011 |
| JP | 2016520981 A | | 7/2016 |
| KR | 20160027744 A | | 3/2016 |
| TW | 1715396 B | * 1/2021 | ........... G01R 31/388 |
| WO | 2000019555 A1 | | 4/2000 |
| WO | 2012117035 A1 | | 9/2012 |
| WO | 2014072702 A1 | | 5/2014 |
| WO | 2022073766 A1 | | 4/2022 |
| WO | 2022079210 A1 | | 4/2022 |

OTHER PUBLICATIONS

"Performance evaluation of porous gas channel ribs in a polymer electrolyte fuel cell", J.P. Owejan, S.G. Goebel, 6 pp. Journal of Power Sources, Dec. 7, 2020.

KIPO International Search Report and Written Opinion based on PCT/US2023/060366 filed Jan. 10, 2023, dated May 2, 2023, 12 pp.

KIPO International Search Report and Written Opinion based on PCT/US2023/066941 filed May 12, 2023, dated Sep. 4, 2023, 9 pp.

\* cited by examiner

FUEL CELL INFORMATION MONITOR AND DATA TRANSFER

TECHNICAL FIELD

The present invention relates, generally, to methods and systems for monitoring a fuel cell stack, and more particularly, to systems and methods for monitoring a fuel cell stack to for variations in electrical output and functioning of fuel cells of a fuel cell stack system.

This application is also related to U.S. patent application Ser. No. 17/572,679 filed on Jan. 11, 2022, entitled "FUEL CELL STACK AND METHOD FOR MANUFACTURE", the disclosure of which is incorporated by reference herein.

This application is also related to U.S. patent application Ser. No. 17/663,097 filed on May 12, 2022, entitled "INTEGRATED CIRCUIT FOR DIAGNOSTICS", the disclosure of which is incorporated by reference herein.

BACKGROUND OF THE INVENTION

Fuel cells electrochemically convert fuels and oxidants to electricity and heat and can be categorized according to the type of electrolyte (e.g., solid oxide, molten carbonate, alkaline, phosphoric acid or solid polymer) used to accommodate ion transfer during operation. Moreover, fuel cell assemblies can be employed in many (e.g., automotive to aerospace to industrial to residential) environments, for multiple applications.

A Proton Exchange Membrane (hereinafter "PEM") fuel cell converts the chemical energy of fuels, such as hydrogen, and oxidants, such as air, directly into electrical energy. The PEM is a solid polymer electrolyte that permits the passage of protons (i.e., H+ ions) from the "anode" side of the fuel cell to the "cathode" side of the fuel cell while preventing passage therethrough of reactant fluids (e.g., hydrogen and air gases). The Membrane Electrode Assembly (hereinafter "MEA") is placed between two electrically conductive plates, each of which has a flow passage to direct the fuel to the anode side and oxidant to the cathode side of the PEM.

Two or more fuel cells may be connected together to increase the overall power output of the assembly. Generally, the cells are connected in series, wherein one side of a plate serves as an anode plate for one cell and the other side of the plate is the cathode plate for the adjacent cell. These are commonly referred to as bipolar plates (hereinafter "BPP"). Alternately, the anode plate of one cell is electrically connected to the separate cathode plate of an adjacent cell. Commonly these two plates are connected back to back and are often bonded together (e.g., bonded by adhesive, weld, or polymer). This bonded pair becomes as one, also commonly called a bipolar plate, since anode and cathode plates represent the positive and negative poles, electrically. Such a series of connected multiple fuel cells is referred to as a fuel cell stack. The stack typically includes means for directing the fuel and the oxidant to the anode and cathode flow field channels, respectively. The stack usually includes a means for directing a coolant fluid to interior channels within the stack to absorb heat generated by the exothermic reaction of hydrogen and oxygen within the fuel cells. The stack generally includes means for exhausting the excess fuel and oxidant gases, as well as product water.

The stack also includes an endplate, insulators, membrane electrode assemblies, gaskets, separator plates, electrical connectors and collector plates, among other components, that are integrated together to form the working stack designed to produce electricity. The different plates may be abutted against each other and connected to each other to facilitate the performance of particular functions.

As indicated, a fuel cell stack includes multiple connected fuel cells. Individual cell voltage monitoring is critical for system control and durability. For example, a cell with low performance can cause numerous failure mechanisms if undetected. Large stacks of fuel cells may sometimes include hundreds of cells, and cell voltage of such cells is currently detected with individual wires where voltage signals are multiplexed through integrated circuits. Managing these wires and their connections is tedious during an assembly of the multiple fuel cells into a fuel cell stack, and there are significant voltage differentials that must be managed inside electronics. The assembly of this system of cell voltage monitor significantly increases a build time and cost of a fuel cell stack.

Thus, there is a need for improved systems and methods for monitoring an operation of fuel cells of an assembled fuel cell system.

SUMMARY OF THE INVENTION

The present invention provides, in a first aspect, a fuel cell including a membrane electrode assembly, a first plate separator and a second plate separator on opposite sides of the membrane electrode assembly, and a voltage sensor for detecting a cell voltage relative to opposite sides of the membrane electrode assembly. A transmitter is coupled to the sensor and configured to wirelessly transmit an indication of the cell voltage.

The present invention provides, in a second aspect, a method for use in monitoring a fuel cell which includes a voltage sensor detecting a cell voltage relative to opposite sides of a membrane electrode assembly of a fuel cell. A transmitter is coupled to the sensor and receives an indication of the cell voltage from the voltage sensor. The transmitter wirelessly transmits an indication of the cell voltage.

BRIEF DESCRIPTION OF THE DRAWINGS

The subject matter which is regarded as the invention is particularly pointed out and distinctly claimed in the claims at the conclusion of the specification. The foregoing and other features and advantages of the invention will be readily understood from the following detailed description of the preferred embodiments taken in conjunction with the accompanying drawings in which:

DETAILED DESCRIPTION OF THE INVENTION

Figure 1:
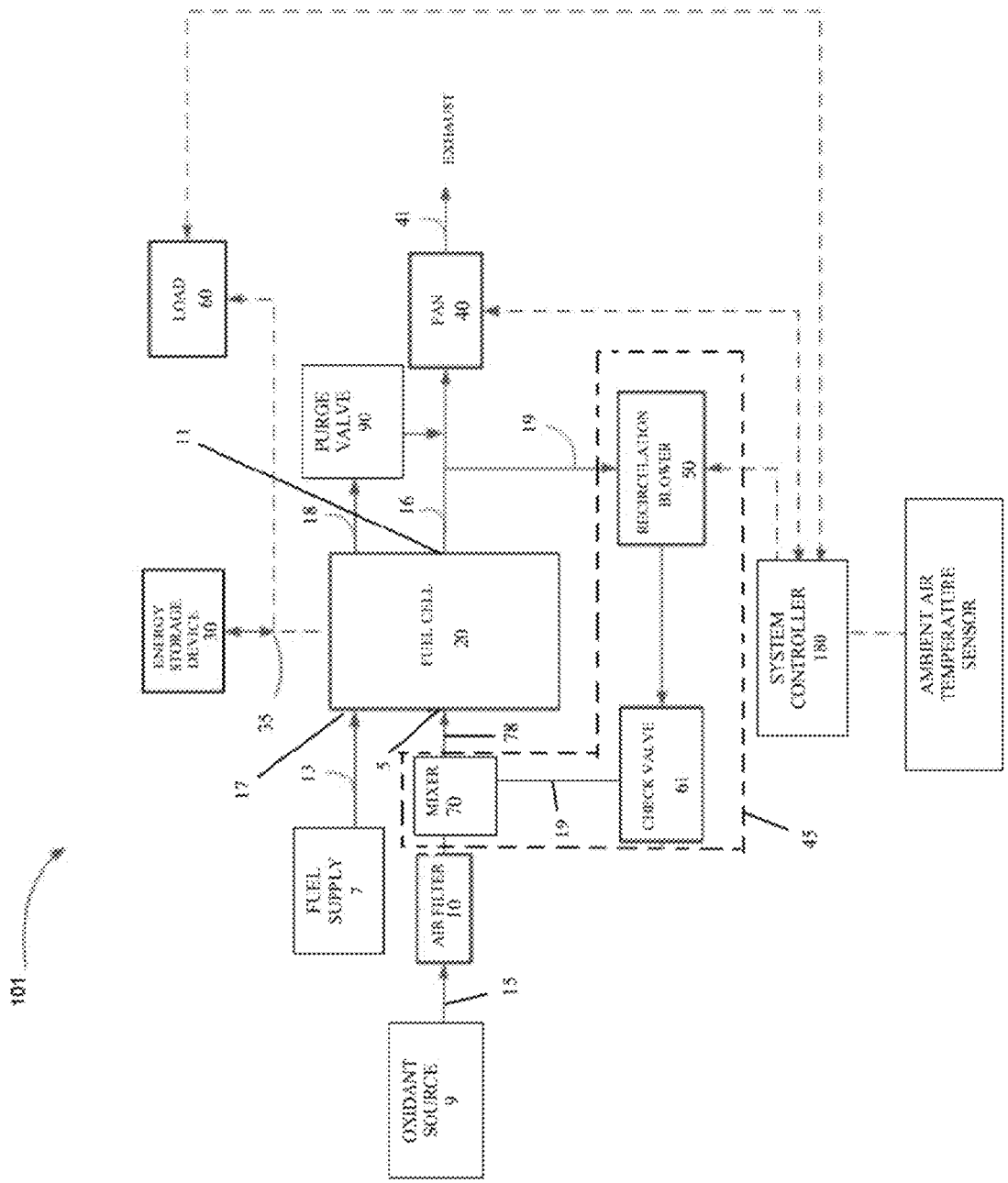
FIG. 1 is a block diagram of a fuel cell system in accordance with the invention.

The present invention will be discussed hereinafter in detail in terms of various exemplary embodiments according to the present invention with reference to the accompanying drawings. In the following detailed description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessary obscuring of the present invention.

Thus, all the implementations described below are exemplary implementations provided to enable persons skilled in the art to make or use the embodiments of the disclosure and are not intended to limit the scope of the disclosure, which is defined by the claims. As used herein, the word "exemplary" or "illustrative" means "serving as an example, instance, or illustration." Any implementation described herein as "exemplary" or "illustrative" is not necessarily to be construed as preferred or advantageous over other implementations. Moreover, in the present description, the terms "upper", "lower", "left", "rear", "right", "front", "vertical", "horizontal", and derivatives thereof shall relate to the invention as oriented in FIG. 1.

Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

In accordance with the principals of the present invention, fuel cell systems and methods for manufacturing a fuel cell stack are provided. In an example depicted in FIG. 1, a fuel cell system 101 is referred to as the assembled, or complete, system which functionally together with all parts thereof produces electricity and typically includes a fuel cell stack 20 and an energy storage device 30. The fuel cell is supplied with a fuel 13, for example, hydrogen, through a fuel inlet 17. Excess fuel 18 may be exhausted from the fuel cell through a purge valve 90 and may be diluted by a fan 40. In one example, fuel cell stack 20 may have an open cathode architecture of a PEM fuel cell, and combined oxidant and coolant, for example, air, may enter through an inlet air filter 10 coupled to an inlet 5 of fuel cell stack 20. Excess coolant/oxidant and heat may be exhausted from a fuel cell cathode of fuel cell stack 20 through an outlet 11 to fan 40 which may exhaust the coolant/oxidant and/or excess fuel to a waste exhaust 41, such as the ambient atmosphere. The fuel and coolant/oxidant may be supplied by a fuel supply 7 and an oxidant source 9 (e.g., air), respectively, and other components of a balance of plant, which may include compressors, pumps, valves, fans, electrical connections and sensors.

Figure 2:
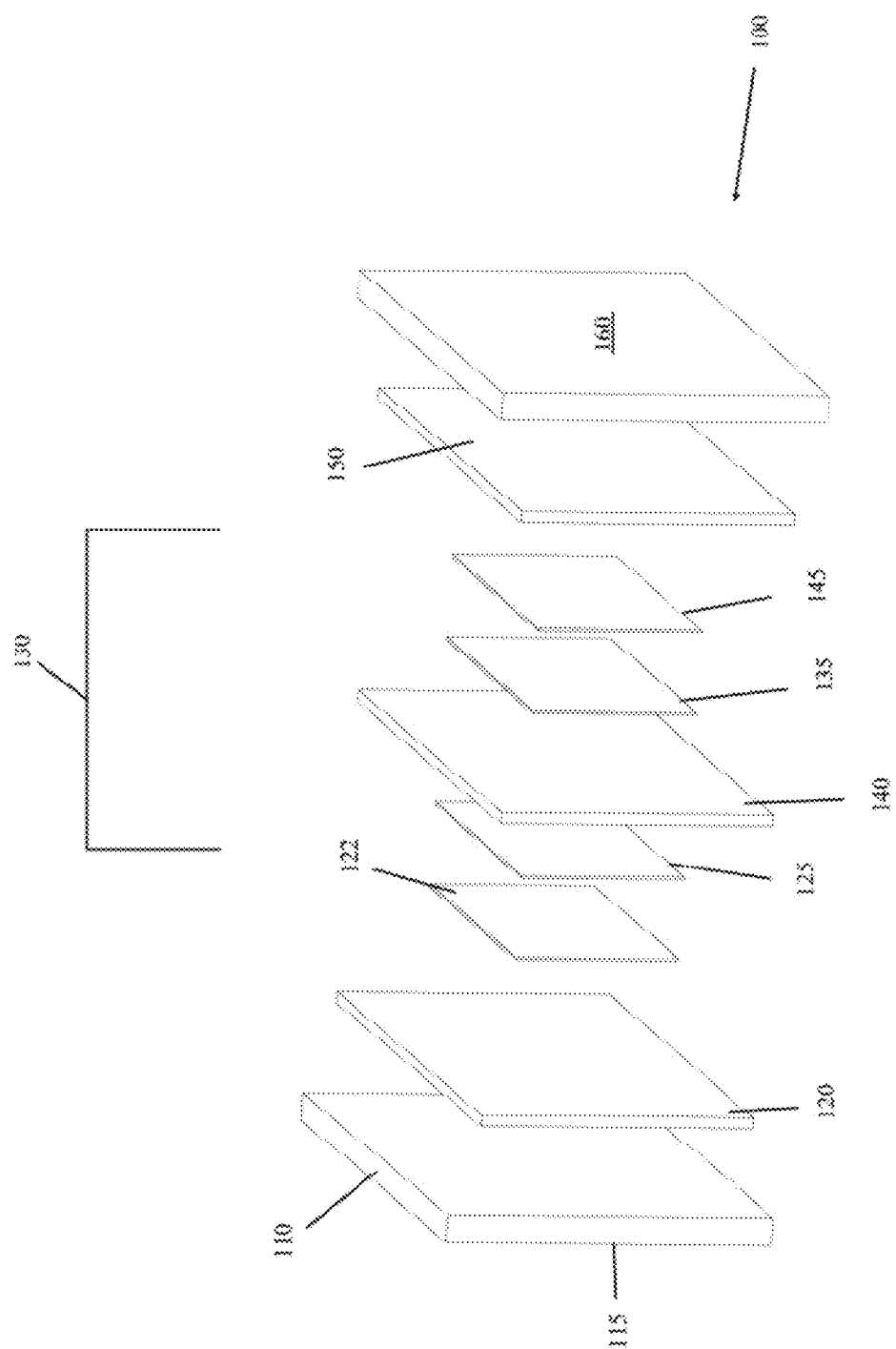
FIG. 2 is a perspective view of a portion of a fuel cell of the fuel cell system of FIG. 1.

FIG. 2 depicts a schematic exploded view of an internal subassembly 100 of fuel cell stack 20 of FIG. 1 including a cathodic plate separator 110 at an outer end 115 and a plate separator seal 120 on an inner side thereof. A membrane electrode assembly (MEA) 130 is located between seal 120 and a second plate separator seal 150. An anode plate separator 160 is on a second end 165 of subassembly 100.

MEA 130 includes a membrane 140 (e.g., an ion conducting membrane) between a cathode side catalyst layer 125 and an anode side catalyst layer 135. A cathode side gas diffusion layer (GDL) 122 is located between cathode side catalyst layer 125 of the membrane electrode assembly and plate separator 110. An anode side gas diffusion layer 145 is located between anode side catalyst layer 135 of the membrane electrode assembly and plate separator 160. Seal 120 and seal 150 may be received in a channel of on an inner side of plate separator 110 and plate separator 160, respectively. In another example, such seals may be injection molded around an MEA (e.g., MEA 130) or another fuel cell component as described below. In another example, such seals may be injection molded around an MEA (e.g., MEA 130) or another fuel cell to provide a sealing function, such as between an MEA and fuel cell plate separators.

Figure 3:
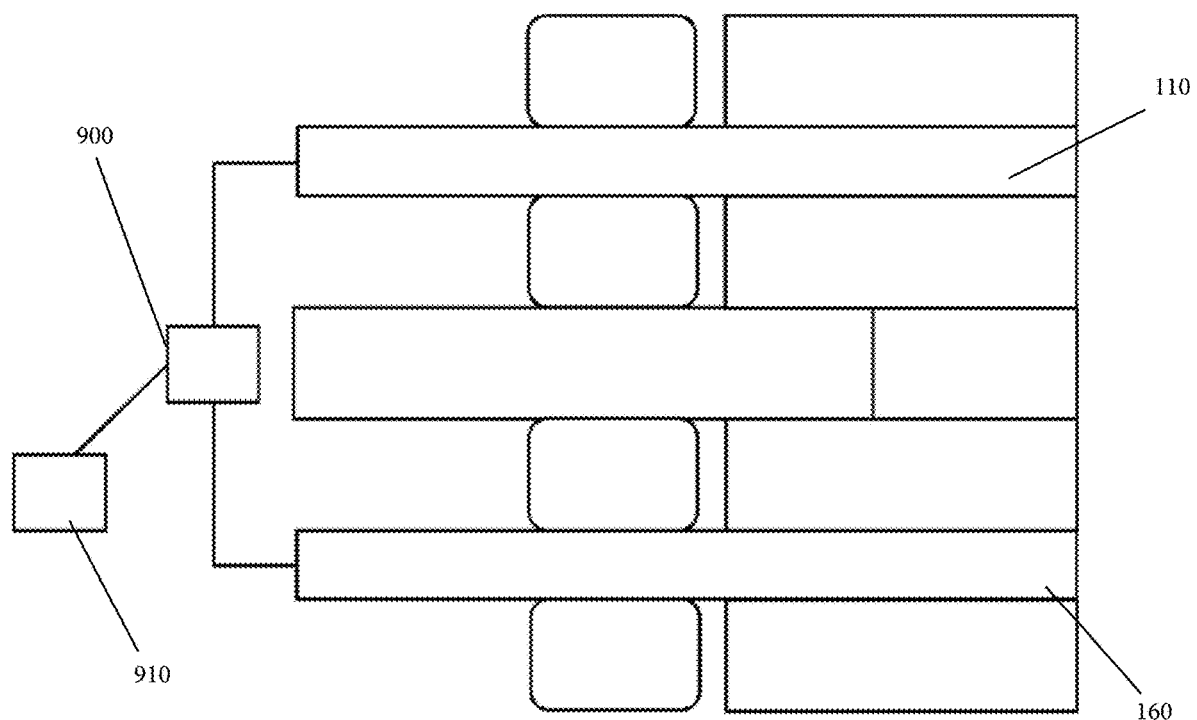
FIG. 3 is a side schematic view of a portion of FIG. 2 further including a voltage sensor and transmitter.

In an example depicted in FIG. 3 a voltage sensor 900 may be electrically connected to opposing bipolar plates 102, e.g., plate separator 110 and plate separator 160 of subassembly 100 of fuel cell stack 20.

Sensor 900 may detect and/or measure a voltage potential between plate separator 110 and plate separator 160. Sensor 900 may be electrically connected to a transmitter 910 which may be configured to wirelessly transmit an indication of the voltage detection or measurement.

Although depicted separately, in an example sensor 900 and transmitter 910 could be a same device, such as a light emitting diode (LED). When a voltage exists between opposing bipolar plates, e.g., plate separator 110 and plate separator 160 of a certain predefined amount (e.g., as per the specifications of a particular LED), a light may be emitted by transmitter 910 (e.g., an LED) which may provide an indication to a user that a voltage is acceptable between the indicated plate separators. For example, such an LED may only light up when a particular amount of voltage (e.g., above about 0.6V) is present thereby informing a user that a voltage of at least the particular amount has been detected by the sensor. A sensor and a transmitter (e.g., an LED) could also be separate devices electrically connected to each other, as depicted.

Figure 4:
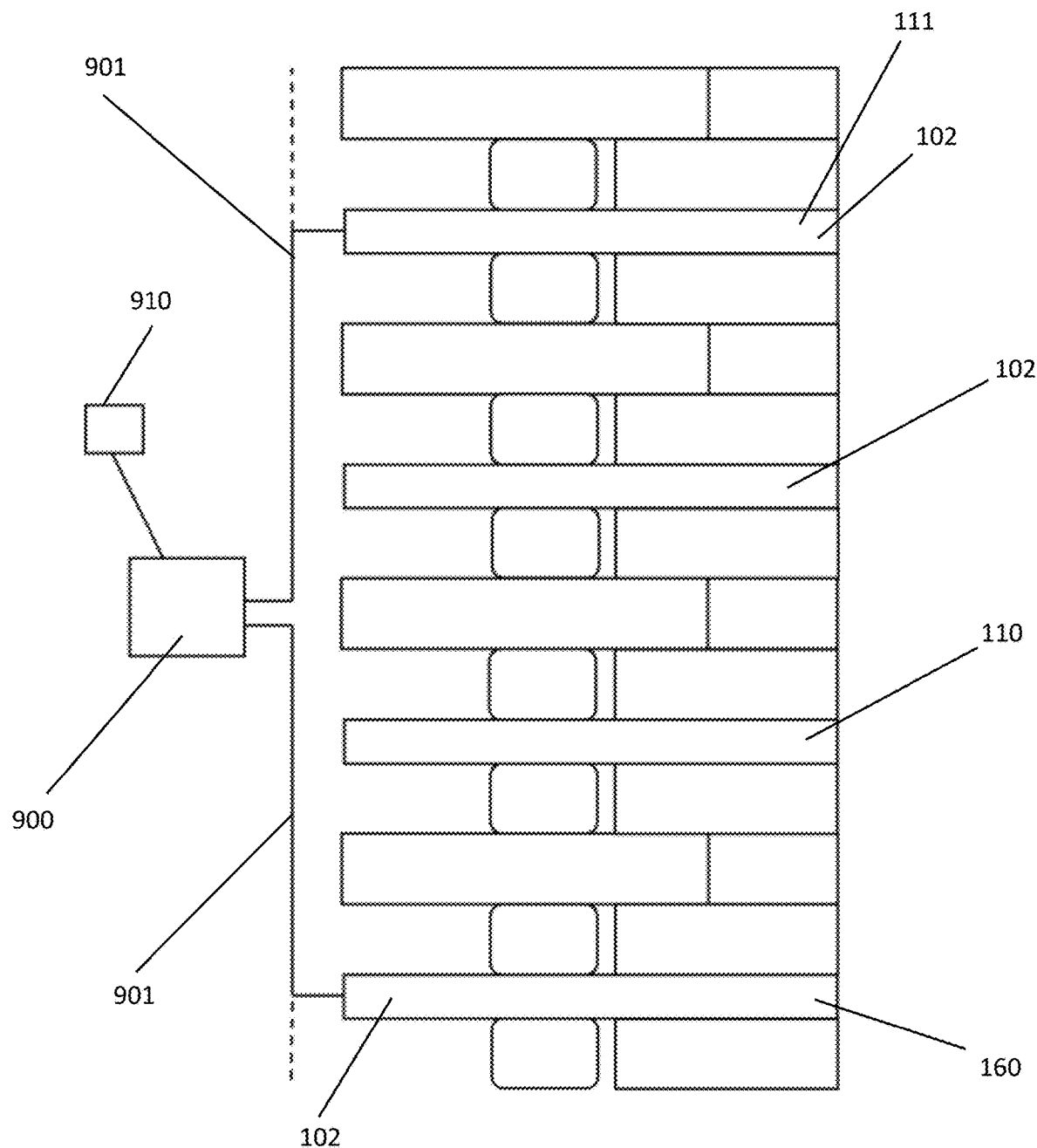
FIG. 4 is a side schematic view of a plurality of fuel cells connected to a voltage sensor and transmitter.

As depicted in FIG. 4, a sensor (e.g., sensor 900) may be electrically connected to various plates or plate separators within a fuel cell stack (e.g., fuel cell stack 20) to provide information relative to more than one fuel cell within the stack. For example, such a sensor may be connected to plates on opposite sides of multiple fuel cells, e.g., sets of two, three, five or ten fuel cells so as to provide voltage or other information relative to such groups of fuel cells. As depicted in FIG. 4, sensor 900 may be electrically connected to plate separator 160 and a plate separator 111 via connecting wires 901 which may be spaced from each other via one or more other bipolar plates (e.g., bipolar plates 102) of fuel cells of a fuel cell stack (e.g., fuel cell stack 20). The connection of a sensor (e.g., sensor 900) to multiple fuel cells allows a user to view, or a controller to receive information relative to, such multiple fuel cells within the stack (e.g., fuel cell stack 20). For example, an illumination or non-illumination of LED's electrically connected to sensors (e.g., sensor 900), coupled to different fuel cells or sets of fuel cells would provide a viewer or user with information relative to which fuel cell, or sets of fuel cells in a stack are operating correctly or efficiently. In another example, an LED or set of LEDs may be configured to illuminate a particular color depending on whether a fuel cell or set of fuel cells is operating at a particular voltage or having other operating characteristics (e.g., current).

Figure 5:
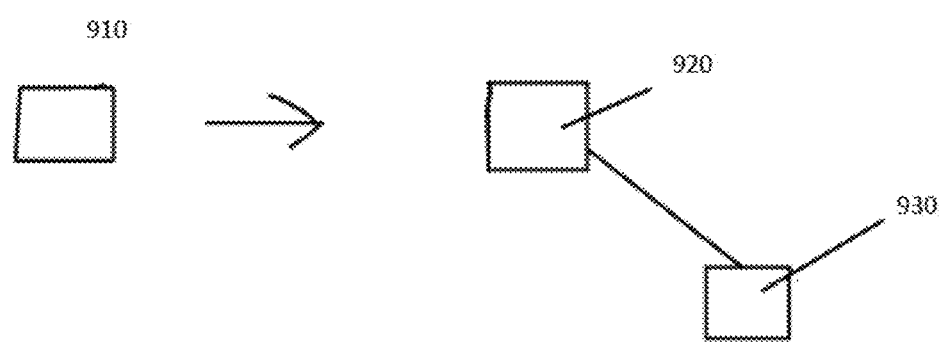
FIG. 5 is a block diagram view of a cell voltage transmitter and receiver coupled to a controller.

In another example, the transmission or emission of information by transmitter 910 (e.g., light emitted by an LED) coupled to sensor 900 may be received by a receiver 920 coupled to a controller 930 configured to control aspects of system 101 and/or stack 20, as depicted in FIG. 5. Such transmission of information may be via an LED emitting light to a photo sensor, an RF transmitter transmitting to an RF receiver, a cell transmitter transmitting to a cell receiver, a Near Field Communication (NFC) sender and receive, or other such wireless technologies.

As described, a transmitter (e.g., transmitter 910) including an LED may merely transfer light to indicate a fuel cell or set of fuel cells is operating acceptably or not operating acceptably. In other examples, additional information may be transferred via the particular transmission of light. For example, via pulse width modulation, information may be transferred from the transmitter (e.g., transmitter 910) to the receiver (e.g., receiver 920) and controller (e.g., controller 930) including a particular voltage provided or other information provided to the sensor and/or transmitter from other sources within a fuel cell stack. For example, a particular location of particular fuel cells, or groups of fuel cells, within a fuel cell stack (e.g., fuel cell stack 20) may be coupled with the particular voltages of each cell and may be transmitted wirelessly (e.g., via pulse width modulation) from a transmitter to a receiver. In such situation, a user may be apprised of a voltage of particular cells within a fuel cell stack. This may allow maintenance on particular fuel cells within the stack to be performed and/or other maintenance to be performed or planned.

Figure 6:
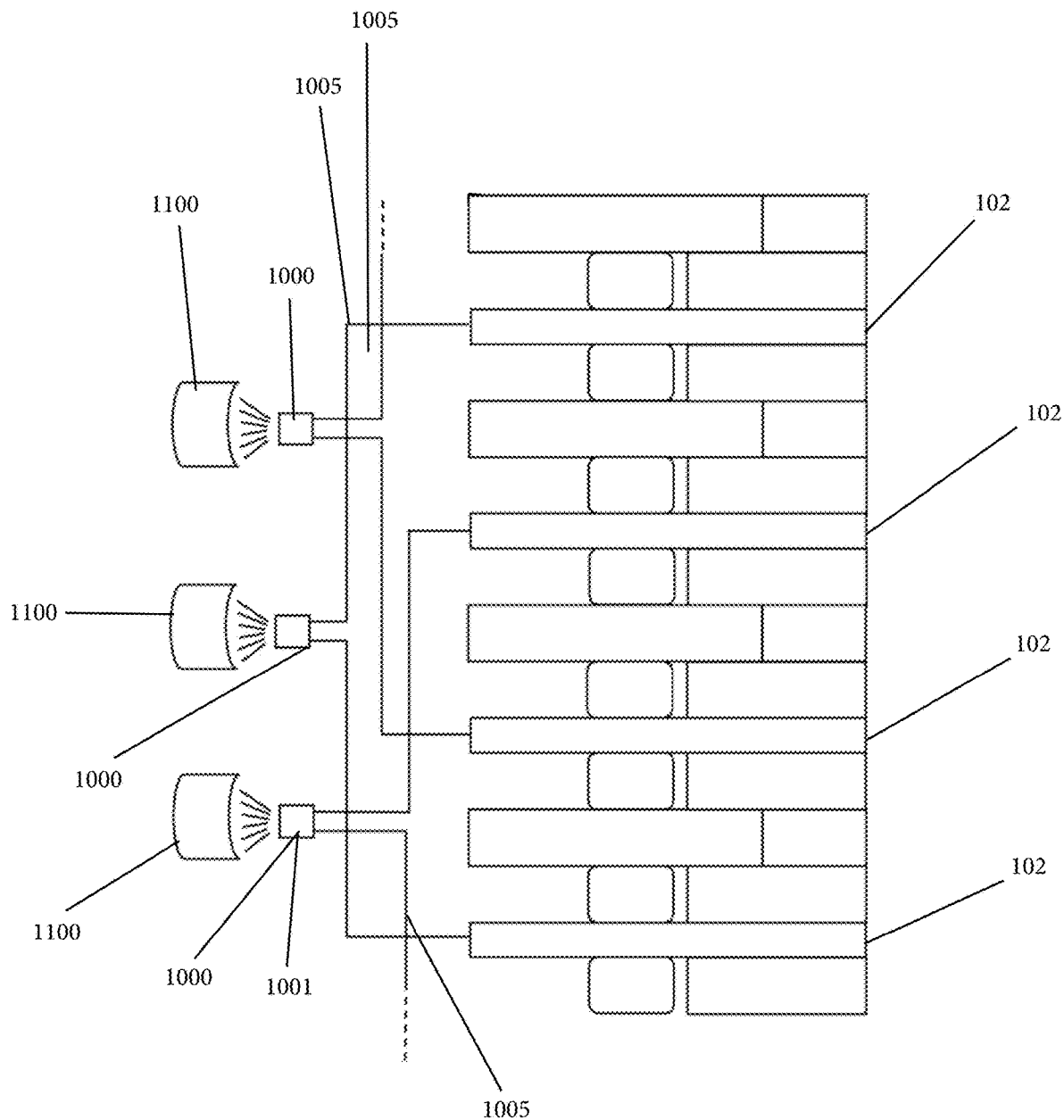
FIG. 6 is a side schematic view of a plurality of fuel cells connected to a plurality of voltage sensors and transmitters.

FIG. 6 depicts an example of three LEDs 1000 being electrically connected (e.g., via connecting wires 1005) to various plate separators (e.g., bipolar plates 102) within a fuel cell stack (e.g., fuel cell stack 20). Each of LEDs 1000 may detect a combined voltage of multiple fuel cells of the stack, i.e., when a particular voltage is present each LED of the LEDs may light up. For example, a red LED 1001 of LEDs 1000 may light at greater than 1.8V and may be connected to, and used to measure, three fuel cells of the stack. If one or more of the cells connected to the red LED is operating at a low potential, this pack of 3 fuel cells may be identified by a non-illuminated LED (e.g., a non-illuminated red LED). Such a configuration of multiple fuel cells connected to a single LED may be implemented at every cell in the stack (e.g., fuel cell stack 20), for example. In this case, an array of multiple such LED arrays would be able to identify individual cells of the fuel cells of the fuel cell stack which have low performance (e.g., via non-lit LEDs). As depicted in FIG. 6, multiple receivers 1100 may also be photosensors utilized to determine whether the indicated LEDs are lit or non-lit. Such receivers may be electrically coupled (e.g., via wired or wirelessly) to and share such information with a controller (e.g., controller 930), as described above.

Figure 7:
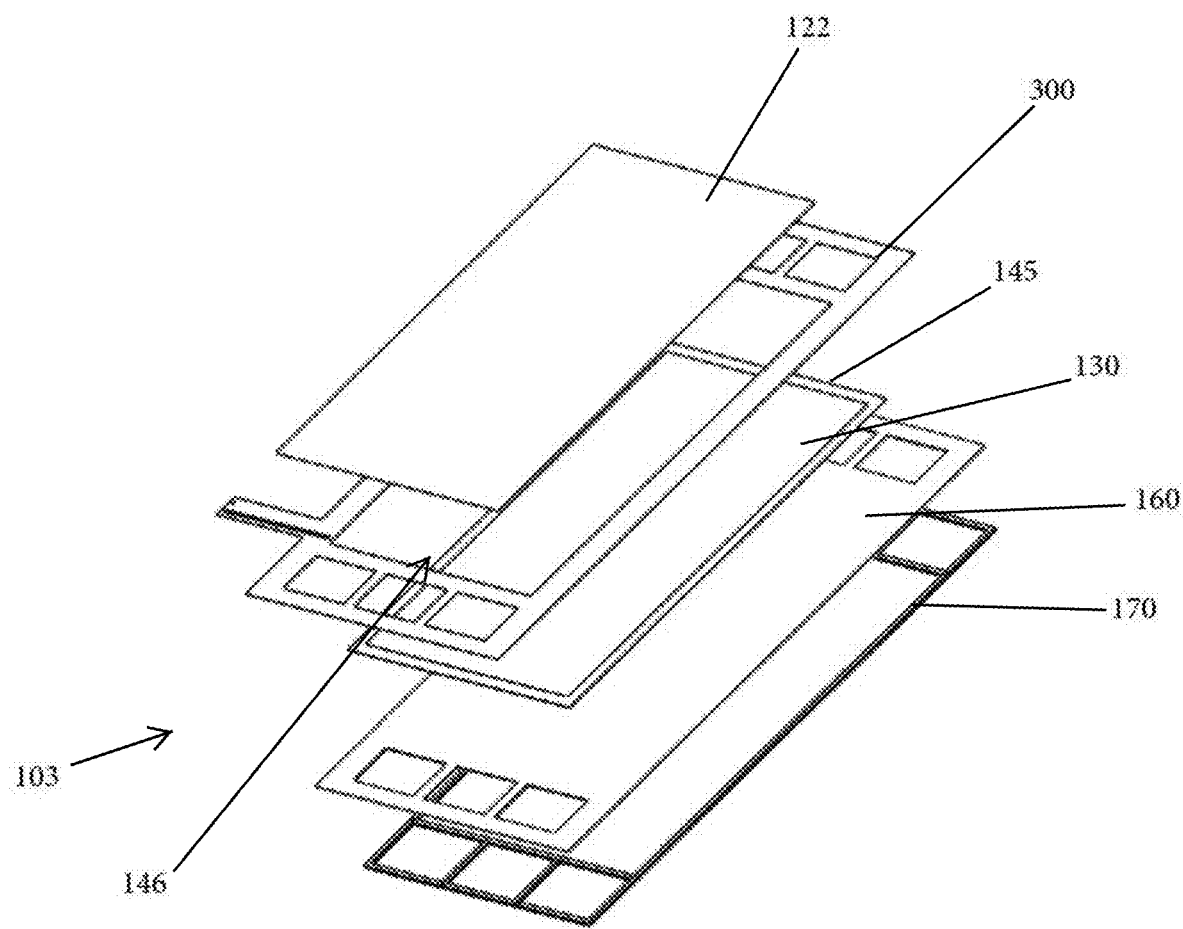
FIG. 7 is an exploded view of the fuel cell of the system of FIG. 2 with seals thereof omitted for clarity.

FIG. 7 depicts a repeating portion 103 of internal subassembly 100 in an exploded view similar to FIG. 2 except that the seals (i.e., seal 120 and seal 150) are omitted for clarity, and cathode plate separator 110 is omitted. A seal or subgasket 300 is located between cathode side catalyst layer 125 and an anode side catalyst layer 135 with membrane 140 being received in a cavity 146 of subgasket 300. A gasket or seal 170 may be located below plate separator 160.

As indicated, membrane 140 may be received in opening 146 of subgasket 300 which may be formed of a nonconductive material, such as a polymer. As depicted, MEA 130 may be attached to anode GDL 145 and a combined MEA 130-GDL 145 may be sandwiched with GDL 122 around subgasket 300 such that the components are attached to each other. For example, the combination may be formed by hot pressing aligned anode and cathode portions (e.g., MEA 130-GDL 145 and GDL 122) to attach such portions to subgasket 300. In an example, heated platens may hold the gas diffusion layers (gas diffusion layer 122, gas diffusion layer 145) and membrane electrode assembly 130 while bonding (e.g., via heat sensitive adhesive or bonding gas diffusion layers to the MEA) occurs to subgasket 300.

Figure 8:
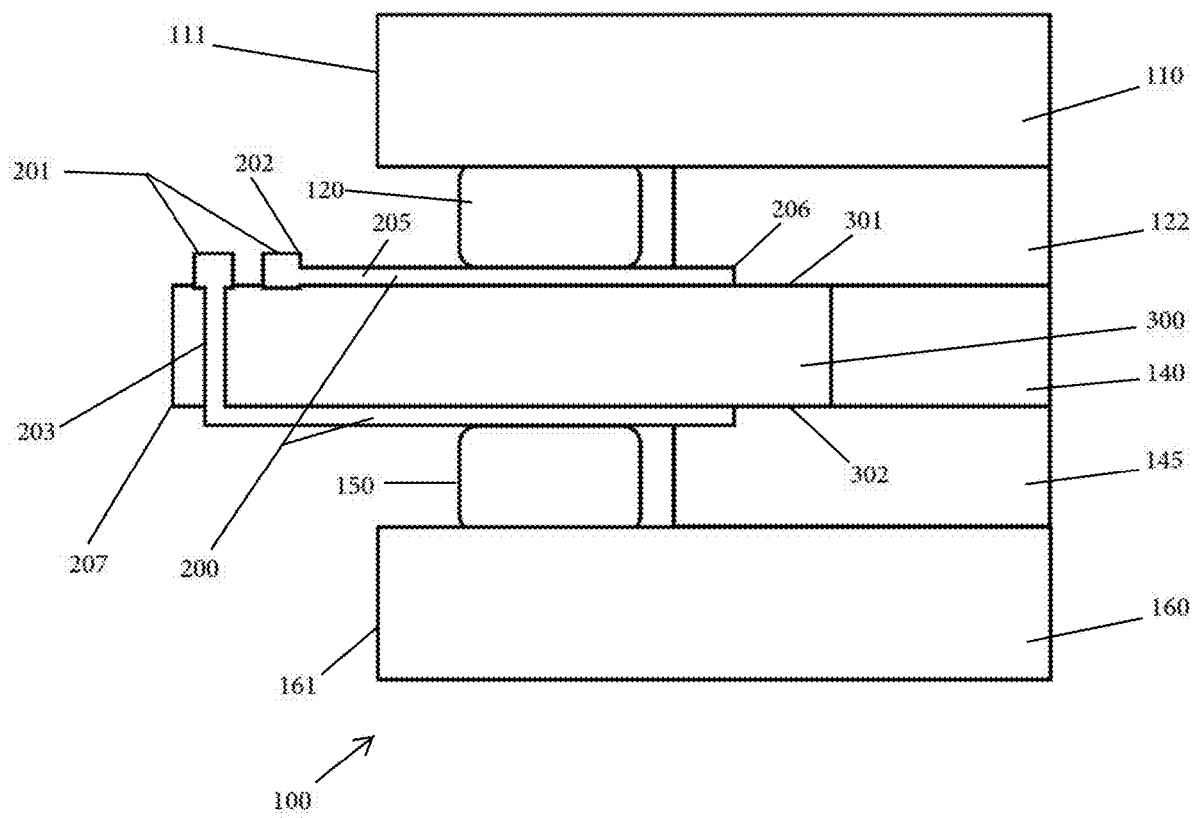
FIG. 8 is a side cross-sectional view of a portion of the fuel cell system of FIG. 3 with metalized traces on a sub-gasket connected to gas diffusion layers thereof.

In an example depicted in FIG. 8, metal traces 200 may be connected to GDLs (e.g., GDL 122 and GDL 145) on opposite sides of a membrane (e.g., membrane 140). As depicted, a first top trace 205 of traces 200 may be attached to, and located on, a first side (e.g., a top side as depicted) 301 of subgasket 300 while a second bottom trace 207 may be attached to, and located on, a second side 302 thereof and may extend vertically therethrough (e.g., through a via) to first side 301. The metal traces (e.g., traces 200) may printed on a subgasket (e.g., subgasket 300) during a metallized printing process or via another method (e.g., vacuum metallization, arc or flame spraying, plating) of depositing a metal or other conductive strip or trace on the gasket. An opening or via may be placed through subgasket after which a metal or other conductive material may be printed or otherwise located in the opening to form a metallized via allowing a bottom trace (e.g., second trace 207) to have an upwardly extending portion 203 extending through a gasket (e.g., gasket 300)

Traces 200 may include electrical connectors 201 (e.g., formed of a conductive metal or a same material as traces 200) on ends thereof opposite the GDLs (e.g., GDL 122 and GDL 145) to allow an electrical connection of the traces (e.g., traces 200) and thus the GDLs to one or more controllers, sensors, or other devices external to subassembly 100. For example, the traces may be connected to a voltage sensor or computerized controller.

As described above, traces 200 may connect to the GDLs (e.g., GDL 122 and GDL 145) to provide an electrical connection between the GDLs and connectors 201 to allow an external connection to the GDLs for purposes of monitoring and or controlling subassembly 100 and fuel cell stack 20. For example, subgasket 300 and traces 200 may extend from GDL 122 and/or GDL 145 toward an exterior of subassembly 100. Subgasket 300 and traces 200 may extend outwardly past an outermost or exterior end 111 of plate separator 110 and/or an outermost or exterior end 161 of plate separator 160, for example. Connectors 201 could be located to an exterior of outer end 111 and/or outer end 161 as depicted. The location of the connectors outside the plate separators and seal 120 and/or seal 150 may allow additional spacing (due to the exterior location) to facilitate an easier connection of the connectors to external devices, such as sensors and controllers.

Figure 9:
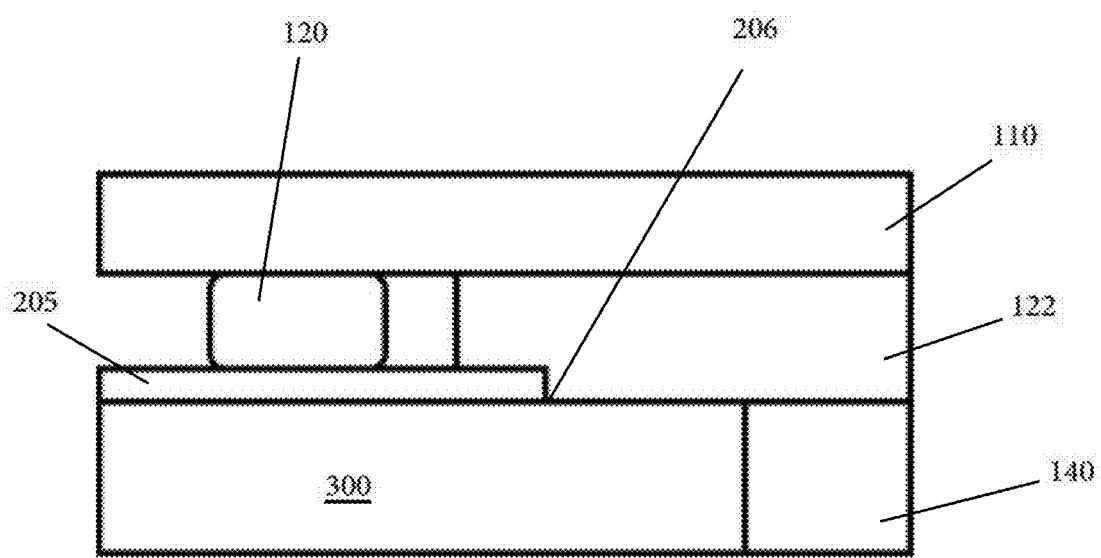
FIG. 9 is a side cross-sectional view of a portion of the system of FIG. 3 showing a metalized trace on a sub-gasket connected to a gas diffusion layer.

FIG. 9 depicts a portion of FIG. 8 including portions of top trace 205, plate separator 110, GDL 122, membrane 140, and subgasket 300. Top trace 205 extends between subgasket 300 and seal or gasket 120 and is received under GDL 122 and on top of subgasket 300. More specifically, a GDL end 206 of top trace 205 opposite connectors 201 contacts, and may be connected to, GDL 122 to provide a connection between GDL 122 and top trace 205 thereby providing an electrical connection between GDL 122 and a first connector 202 (FIG. 5) of connectors 201. Second trace 207 may extend between subgasket 300 and seal or gasket 150 and be received under GDL 145 and on top of subgasket 300, as depicted in FIG. 5, for example. Further, second trace 207 may extend through subgasket as described above.

Figure 10:
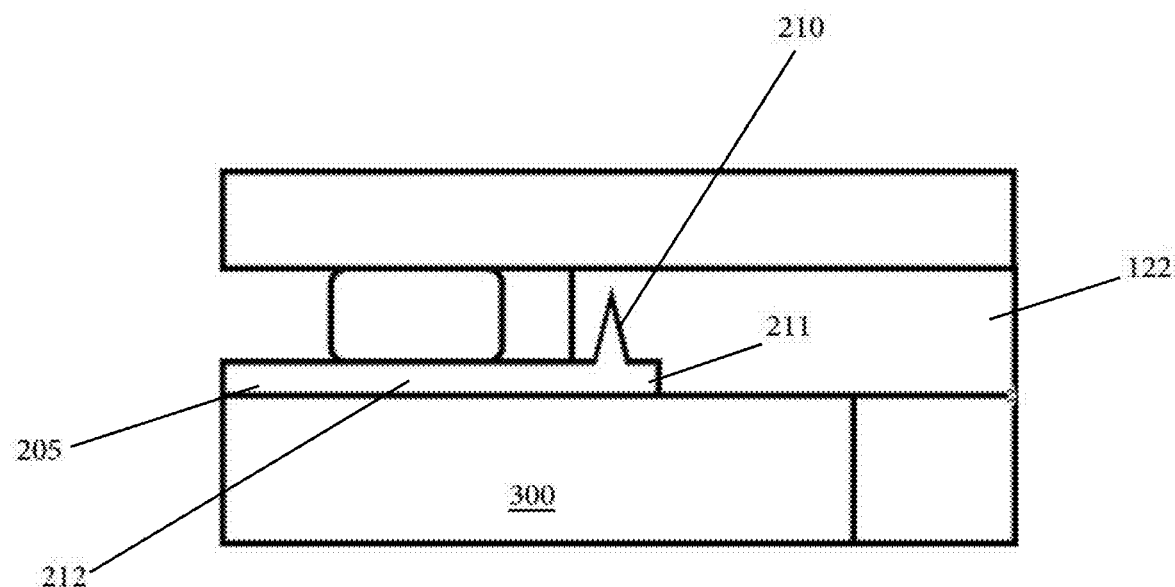
FIG. 10 is a side cross-sectional view of a portion of a fuel cell system according to FIG. 3 with a metalized trace on a sub-gasket having an upwardly projecting portion.

In another example, depicted in FIG. 10, first trace 205 may include a vertically extending spike 210 on or near an end 211 thereof to allow a further penetration of trace 205 into GDL 122 relative to a laterally extending portion 212 and end 211 of trace 205. Spike 210 may extend into GDL 122 (but may avoid extending through GDL 122 into plate separator 110) to provide a better electrical connection (due to a larger surface area and dimensional extent) between trace 205 and thus connector 202 relative to GDL 122. First trace 205 having spike 210 may be formed via additional metal or other conductive material being deposited (e.g., printed) on trace 205 to form spike 210 during formation of first trace 205 or in a subsequent step. For example, spike 210 may be formed by stamping a metallized plastic forming trace 205. Further, spike 210 may be formed by folding and cutting such metallized plastic. Second trace 207 (not depicted in FIG. 10) may extend between subgasket 300 and seal or gasket 150 and be received under GDL 145 and on top of subgasket 300, as depicted in FIG. 5, for example. Further, second trace 207 may extend through subgasket as described above.

Figure 11:
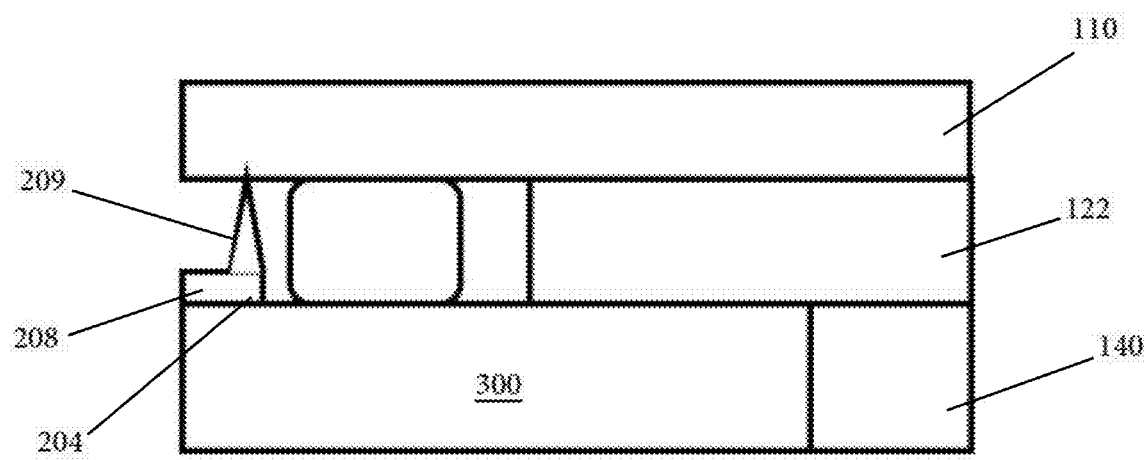
FIG. 11 is a side cross-sectional view of a portion of a fuel cell system according to FIG. 3 with a metalized trace on a sub-gasket having an upwardly projecting portion.

In a further example depicted in FIG. 11, a trace 208 may be substituted for first trace 205, relative to the description above, and an upwardly extending portion 209 thereof may extend upwardly from a portion 204 of trace 208 connected to subgasket 300 at a lateral position relative to GDL 122 such that trace 208 does not extend between gasket 120 and subgasket 300. Upwardly extending portion 209 of trace 208 may be formed via the methods described for spike 210 and may extend upwardly to contact plate separator 110. A second trace (not shown) may be substituted for second trace 207, relative to the description above, and may be located extend along an opposite side of subgasket 300 vertically relative to trace 208 and may similarly extend downwardly to contact plate separator 160. Such second trace could also extend through subgasket 300 similar to trace 207.

Figure 12:
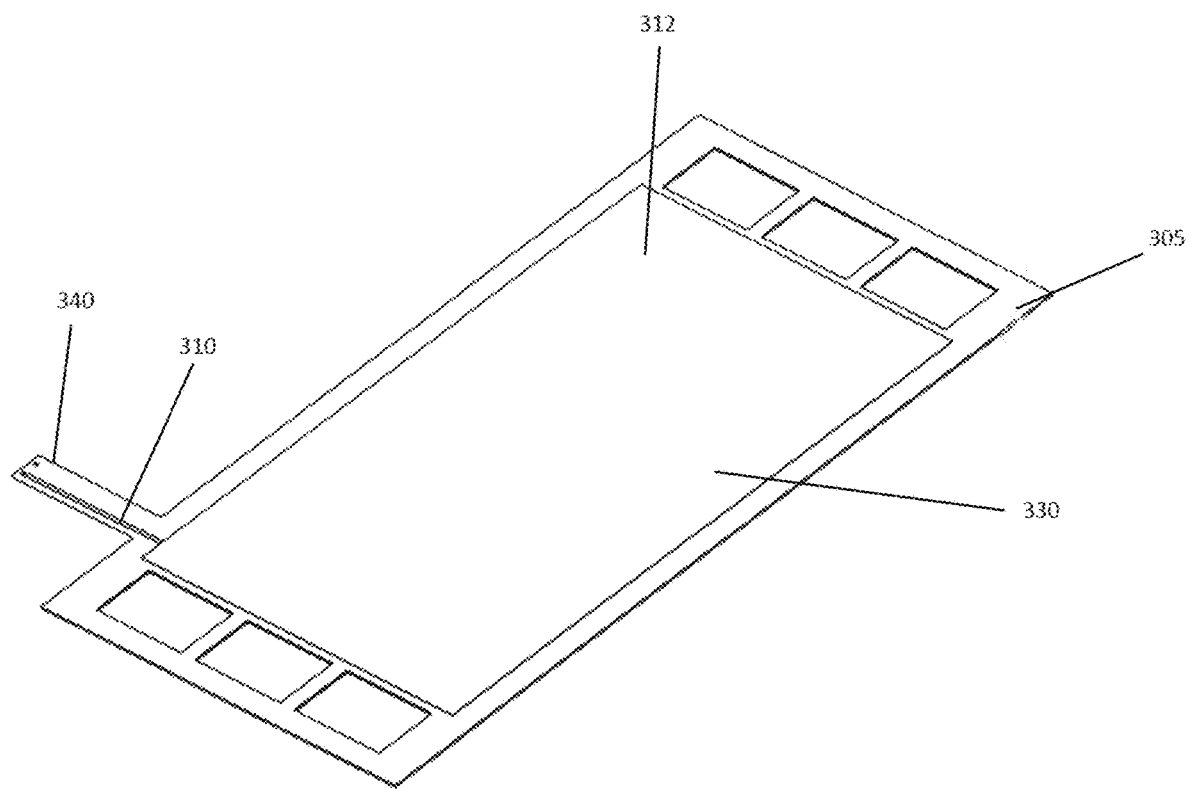
FIG. 12 is a perspective view of a sub-gasket having a tab and receiving a membrane electrode assembly in accordance with an aspect of the present invention.
Figure 13:
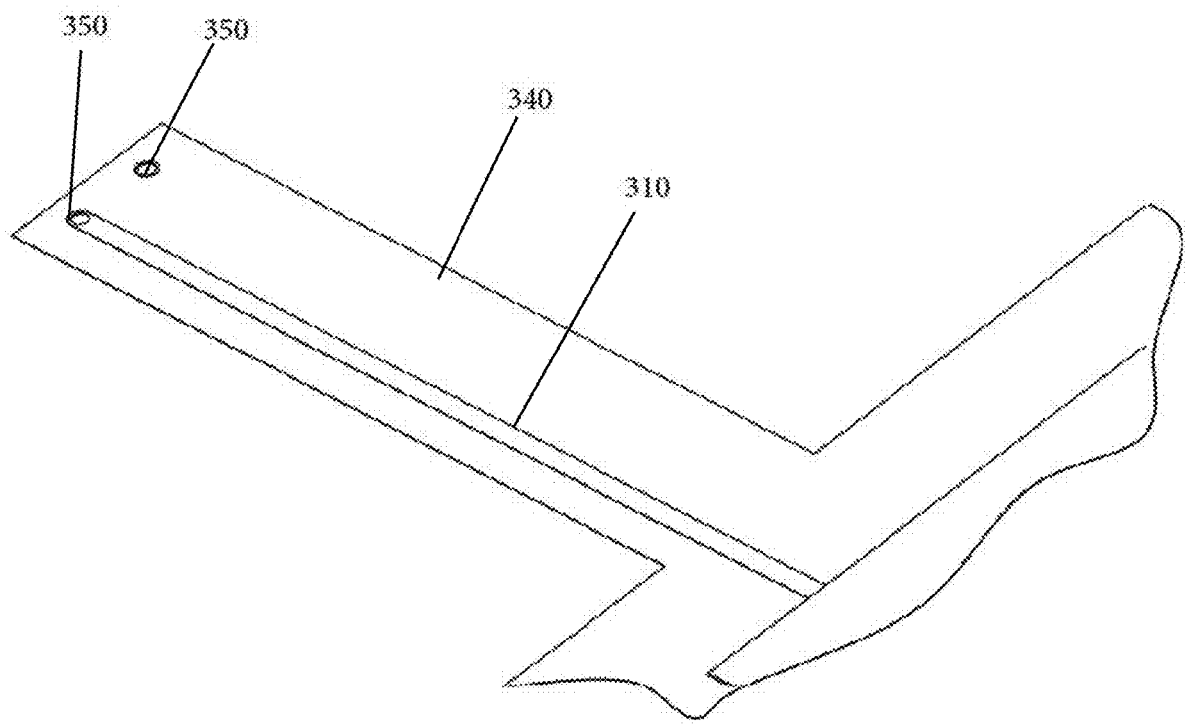
FIG. 13 is an enlarged perspective view of the tab of FIG. 12.

In an example depicted in FIGS. 12-13, a subgasket 305 may be connected to an MEA 330 and a trace 310 may be received on subgasket 130, similar to that described above relative to subgasket 300, MEA 130 and trace 205. Further, subgasket 305 may include a projecting tab 340 and trace 310 may extend from a GDL 312 similar to GDL 122 and GDL 145 described above. Further, a second trace (not shown) may be located on an opposite side of subgasket 305 similar to trace 207 described above. Connectors 350 may be located on subgasket 305 (e.g., tab 340) and connect to the traces to allow an external device (e.g., a voltage sensor or electronic controller) to connect to the traces and thus the GDL's (not shown) on opposite sides of the MEA. Tab 340 may have a longitudinal dimension extending away from a remainder of gasket 305 and a fuel cell stack (e.g., fuel cell stack 20) sized (along with a transverse dimension thereof) to allow connectors 350 to be spaced from an outside surface or casing of a subassembly (e.g., subassembly 100) or a fuel cell stack (e.g., fuel cell stack 20). Such spacing may facilitate the connection to the device and/or facilitate operation of a device to be connected to the connectors. Also, tab 340 may have a transverse width dimension which is smaller than the indicated longitudinal dimension which may allow multiple such tabs to be located adjacent one another in a lateral direction to facilitate multiple connections to various fuel cells or other components of a fuel cell stack (e.g., fuel cell stack 20).

Figure 14:
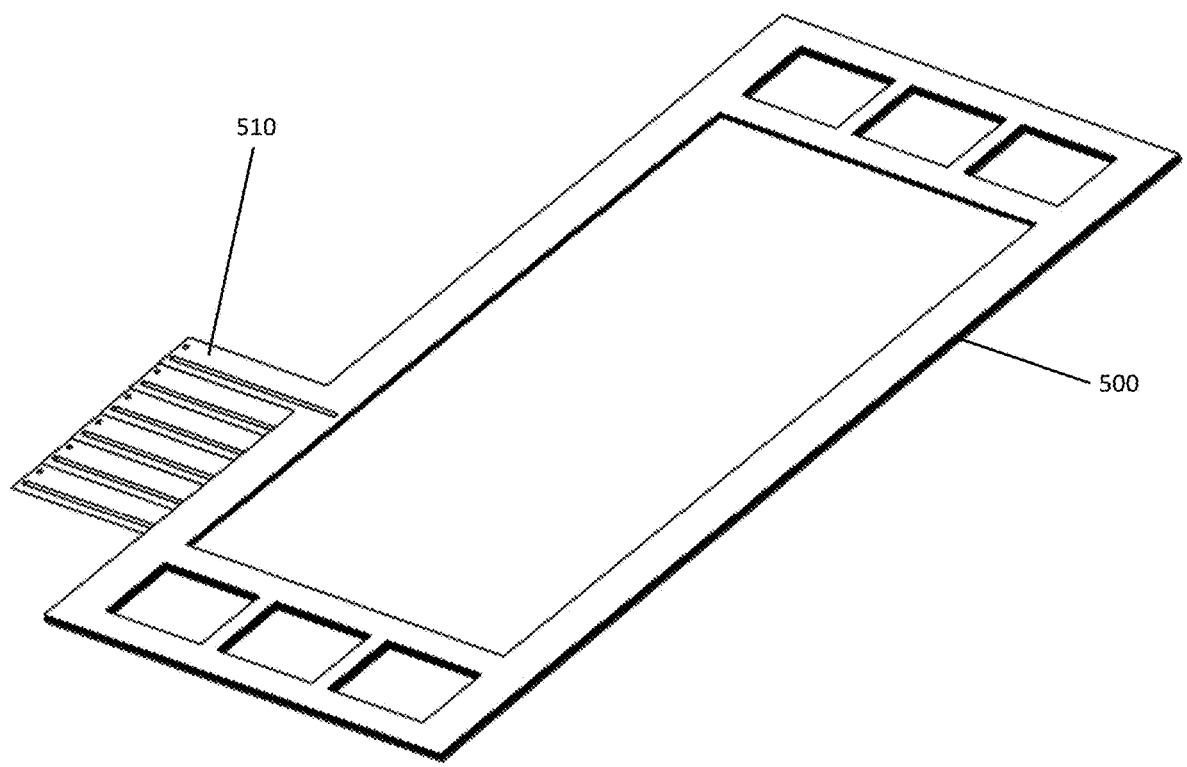
FIG. 14 is a perspective cross-sectional view of a plurality of sub-gaskets receiving membrane electrode assemblies with the sub-gaskets having staggered tabs in accordance with an aspect of the present invention.
Figure 15:
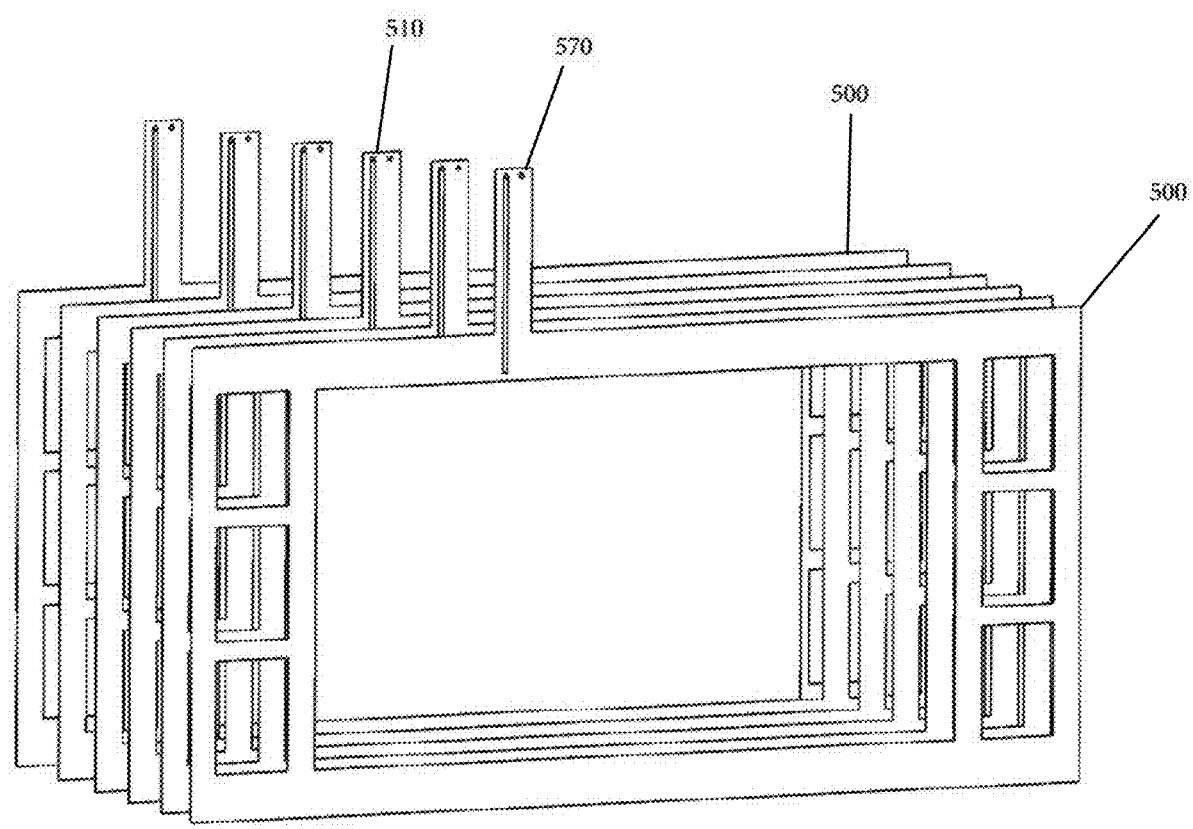
FIG. 15 is an exploded view of the sub-gaskets of FIG. 14.

FIGS. 14-15 depict multiple subgaskets 500 similar to subgasket 305, but with each subgasket having tabs 510 (similar to tab 340) staggered or located laterally to each other along longitudinal dimensions of the gaskets (which may have edges thereof aligned) and accompanying subassembly or fuel cell stack (e.g., fuel cell stack 20). As indicated, the lateral location of the tabs relative to each other may facilitate connection to multiple devices (e.g., sensor(s) or controller(s)) along longitudinal dimensions of the gaskets and may provide space (e.g., due to a longitudinal extension of the tabs from a remainder of the fuel cell stack and the lateral location of the tabs relative to each other) for connections to such devices and/or provide space between the tabs and devices to allow better functioning of the devices.

Figure 16:
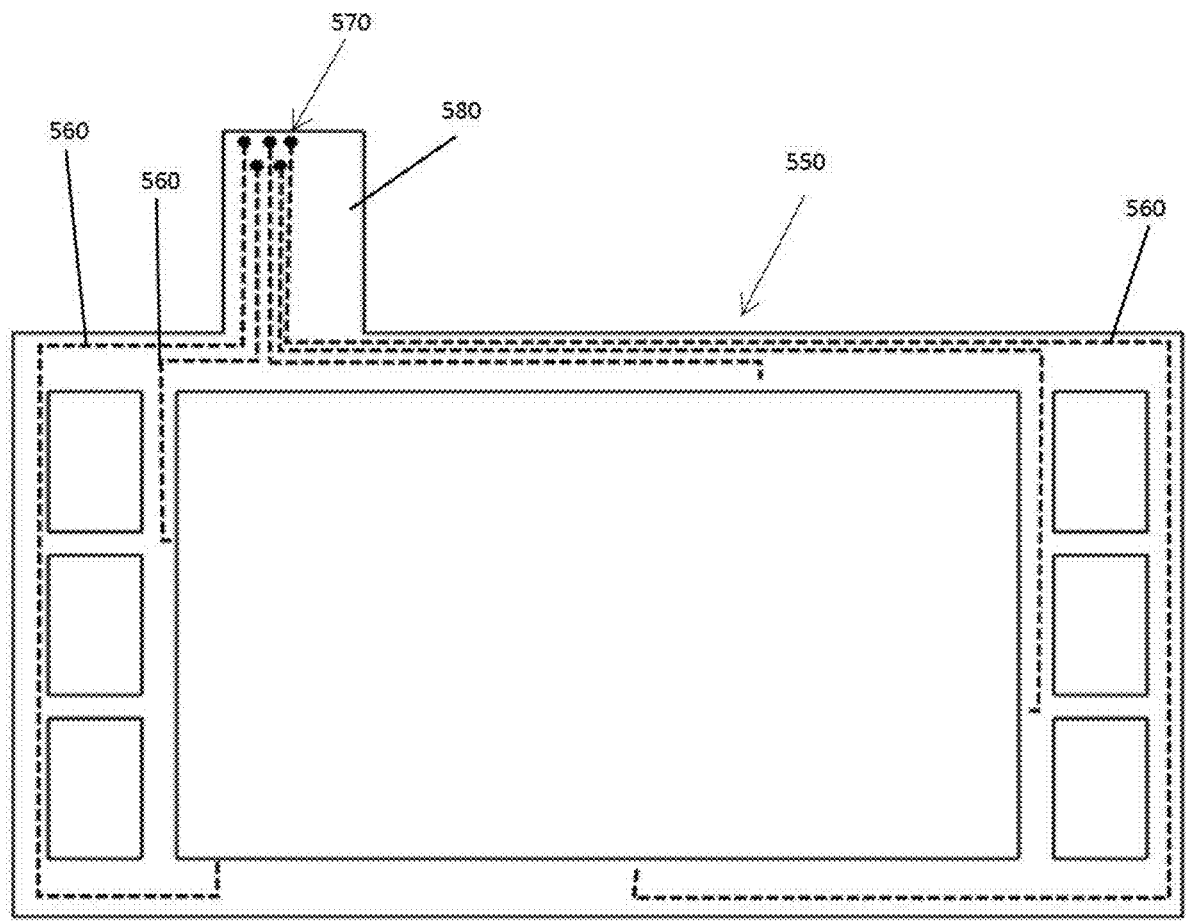
FIG. 16 is a top view of a sub-gasket having a plurality of traces in accordance with an aspect of the present invention in accordance with an aspect of the present invention.

FIG. 16 depicts another example of a subgasket 550, similar to the subgaskets (e.g., subgasket 300, subgasket 305, subgaskets 500) as described above, except that subgasket 550 includes multiple conductive traces attached thereto via metallized printing or other deposition. For example, subgasket 550 may include traces 560 which extend along subgasket 550 to various locations to allow an electrical connection between such locations and connectors 570 located on a tab 580 similar to the tabs (e.g., tab 340, tab 510) described above. Further, such traces (e.g., traces 560) may lead from tab 580 to sensors or other devices located on or adjacent to subgasket 550.

Figure 17:
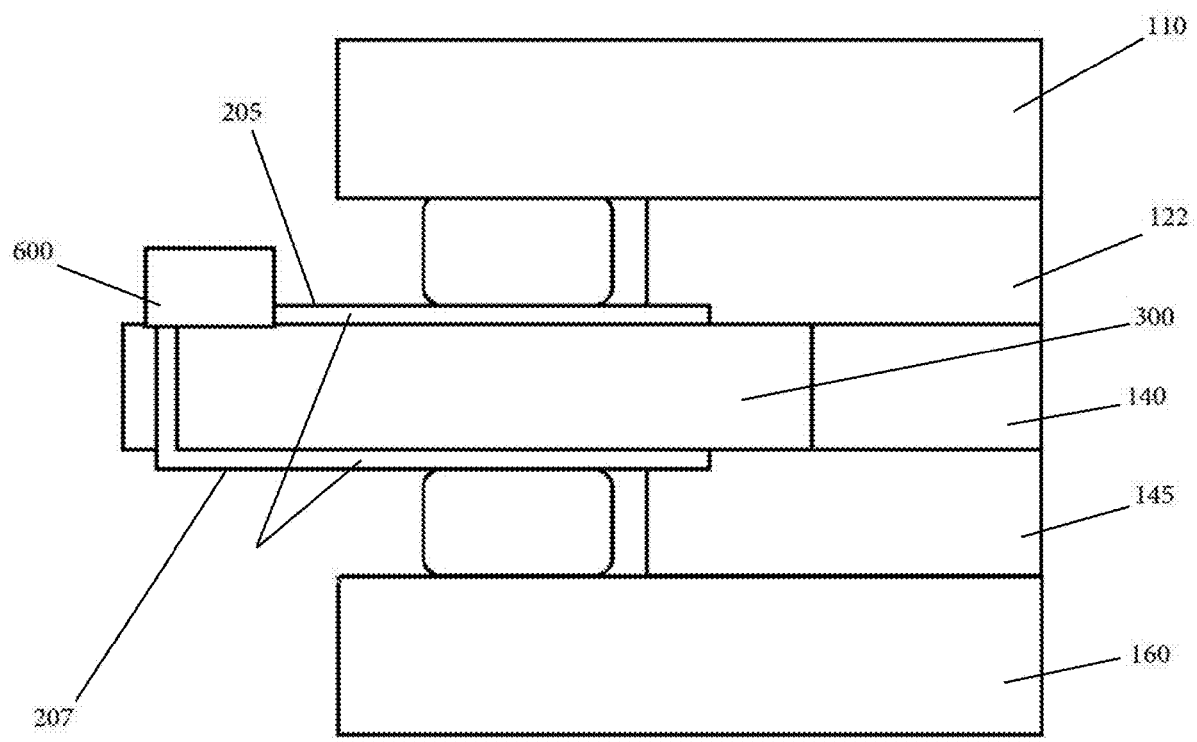
FIG. 17 is side cross-sectional view of a portion of the fuel cell system of FIG. 3 with metalized traces on a sub-gasket connected to gas diffusion layers thereof and an external monitoring or control device in accordance with an aspect of the present invention.

FIG. 17 is identical to FIG. 8 except that a device 600 is connected to connectors 201 of subassembly 100. In one example, device 600 could be a voltage sensor. The connection of the traces (e.g., trace 205, trace 207) to the GDLs (e.g., GDL 122 and GDL 145) may allow such a sensor to measure a voltage relative to each side of the membrane (e.g., membrane 140) with a circuit thus formed powered by the fuel cell (e.g., subassembly 100) at 0.2 to 0.9 V when operating properly, for example. Device 600 could also be an electronic controller, temperature sensor or other device for monitoring fuel cell stack (e.g., fuel cell stack 20).

Figure 18:
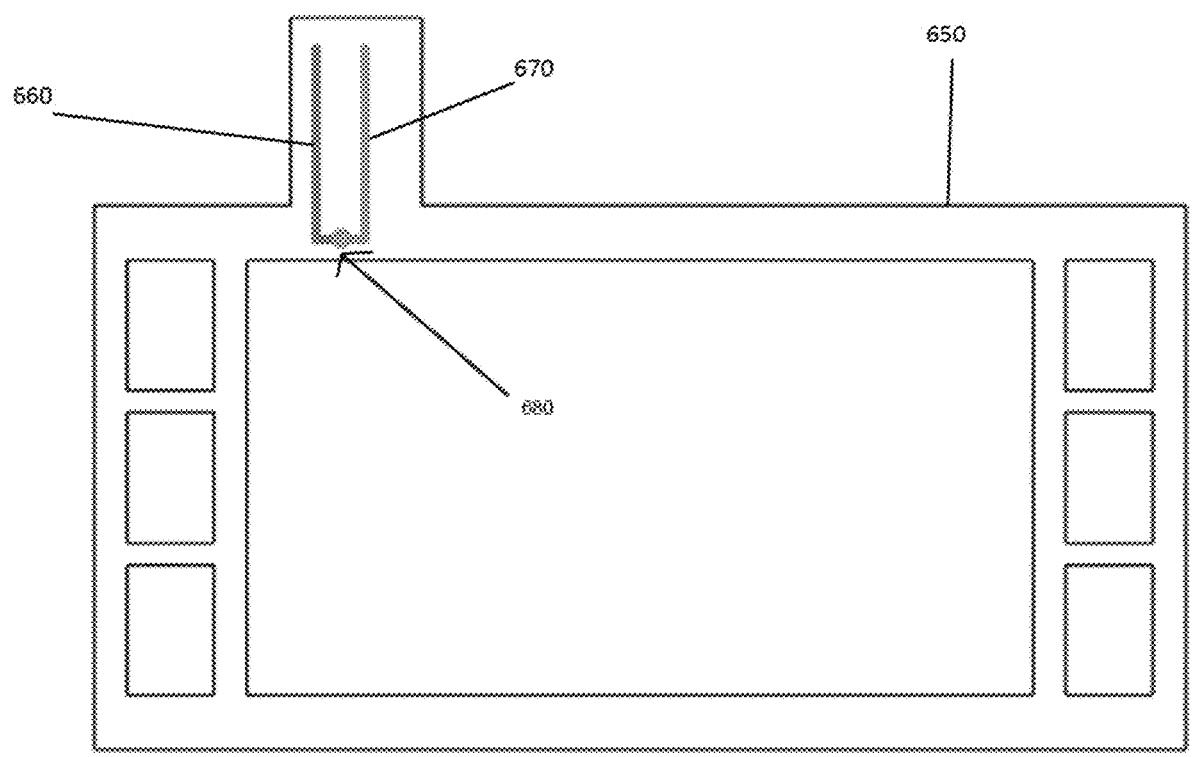
FIG. 18 is a top view of a sub-gasket including a thermocouple junction formed of metal traces in accordance with an aspect of the present invention.
Figure 19:
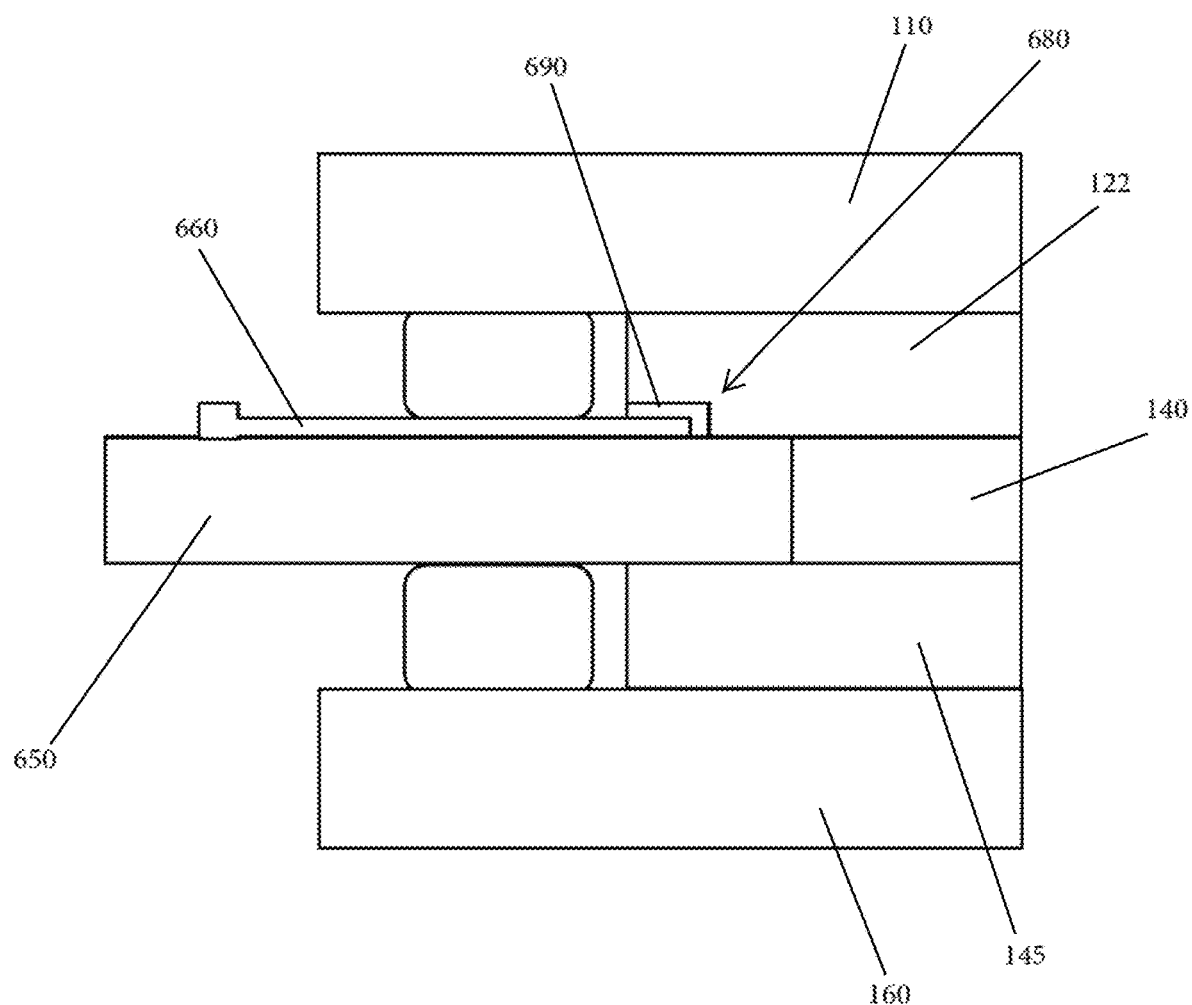
FIG. 19 is a side cross-sectional view of a fuel cell system including the thermal couple junction of FIG. 18.

In an example depicted in FIGS. 18-19, a subgasket 650 may include a first trace 660 and a second trace 670 formed of dissimilar metal types such that differences in temperature would cause changes in electrical potential thereby creating a thermal coupled junction 680. More specifically, second trace 670 may overlay first trace 660 and thermocouple junction 680 such that a change in temperature may be sensed through an electrical connection between the first trace and second trace. As depicted in FIG. 16, a seal 690 may electrically insulate thermocouple junction 680 from GDL 122. In an example, an increase or decrease in temperature may be sensed through an electrical connection between first trace 660 and/or second trace 670 and GDL 122.

Figure 20:
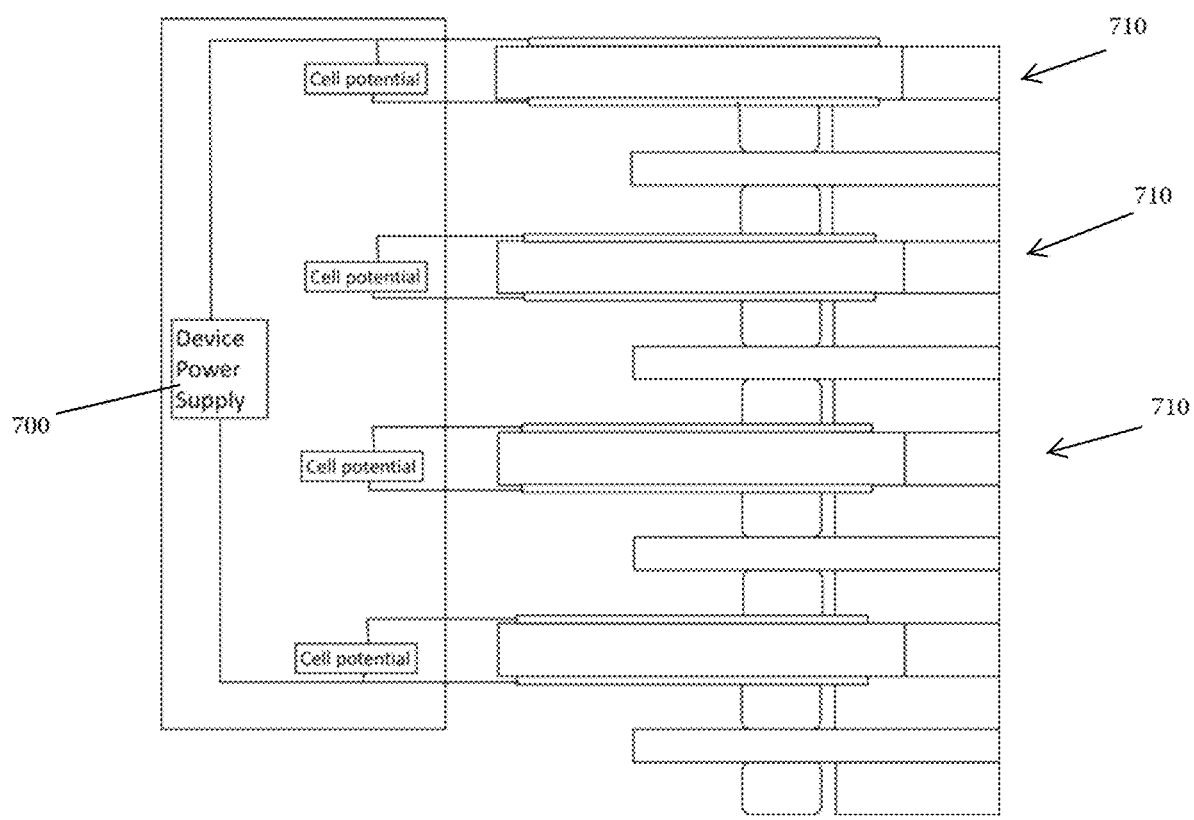
FIG. 20 is a side cross-sectional view of a fuel cell system including a plurality of fuel cells having a device connected to multiple fuel cells thereof for powering the device in accordance with an aspect of the present invention.

As depicted in FIG. 20, a device 700 may be electrically connected to tabs (e.g., tab 340, tab 510, FIGS. 11-12) of multiple fuel cells of a fuel cell stack (e.g., fuel cell stack 2). Such connection to multiple fuel cells within a stack may provide sufficient power to power a device, such as device 700, which may be utilized to measure aspects of the fuel cell stack, control elements (e.g., motors or other balance of plant) of the stack or provide other necessary functions. Similarly, a device, such as device 700, could be utilized to provide measurements of the stack being powered by the stack at higher electrical potentials.

Figure 21:
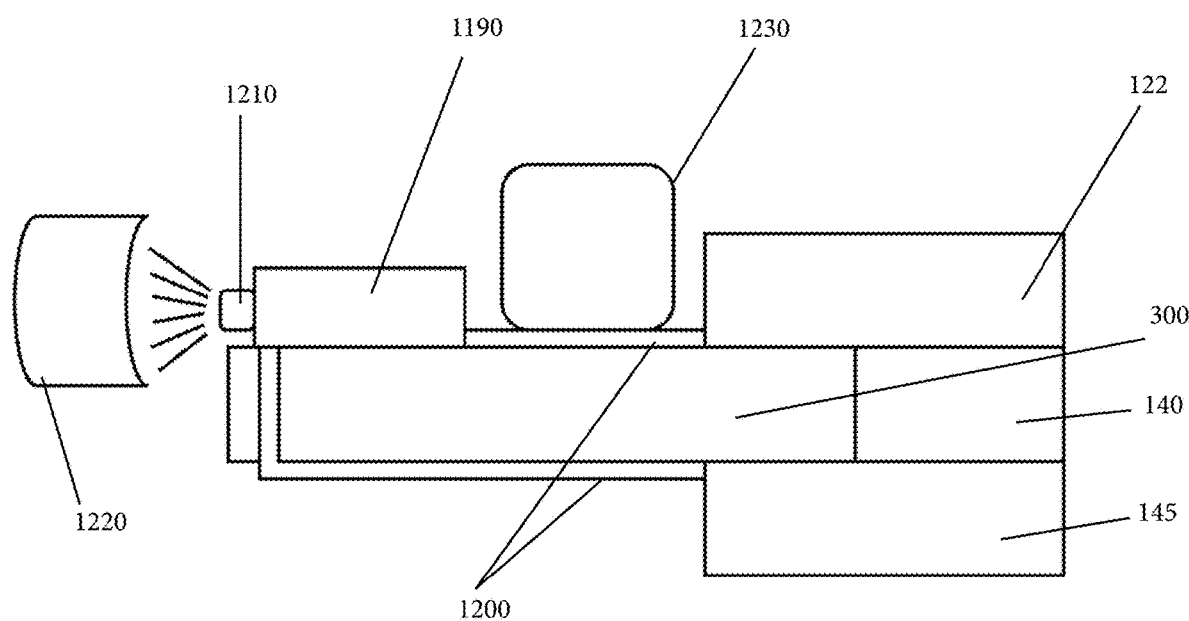
FIG. 21 is a side schematic view of a voltage monitor and transmitter.

In an example depicted in FIG. 21, an integrated circuit 1190 may be connected to metal traces 1200 connected to GDLs (e.g., GDL 122 and GDL 145) on opposite sides of a membrane (e.g., membrane 140). The connection of the traces to the GDLs allow integrated circuit 1190 to measure a voltage relative to each side of the membrane with a circuit thus formed powered by the fuel cell (e.g., subassembly 100) at 0.2 to 0.9 V when operating properly, for example. Integrated circuit 1190 may be connected to or may include a transmitter 1210 (e.g., an LED powered by a DC/DC step-up converter, such as an Analog Devices LTC3105) configured to wirelessly send an indication of voltage to a receiver 1220 (e.g., a photosensor). Integrated circuit 1190 and transmitter 1210 may send information of the measured voltage via an LED configured to light up at a particular voltage (e.g., above 0.6V), or a particular voltage and/or other relevant information (e.g., temperature, impedance or part numbers) may be sent via pulse width modulation, or another means of sending such information wirelessly to a receiver (e.g., receiver 1220). Integrated circuit 1190 may also include or be coupled to a controller to allow processing for receiving data from one or more fuel cells and allowing such data to be sent via pulse width modulation. As described above, membrane 140 may be formed as part of an MEA (e.g., MEA 130) on a web (e.g., web 300) and may have the metal traces (e.g., Traces 1200) printed on a web (e.g., web 300) during a web based manufacturing process. A seal or gasket 1230 may also be present between sensor 1190 and a GDL (e.g., GDL 122).

As indicated above, transmitters (e.g., transmitter 910, LEDs 1000, transmitter 1210) connected to sensors (e.g., sensor 900, integrated circuit 1190) for providing indication of cell voltage among one or more fuel cells of a fuel cell stack may be LEDs or another wireless transmitter that may be wirelessly coupled to a receiver (e.g., receiver 930, receivers 1100, receiver 1220) or merely provide a visible indication of such voltage (via a color LED). The use of LEDs as compared to other methods of transmission of fuel cell information from a fuel cell to a position remote from such a fuel cell provides a low forward voltage, e.g., (1.2V-3.0V), with a diode of the LED resisting reverse current. LEDs avoid radio frequency interference issues and allow simple signal processing. LEDs may further be small in size and include low-cost circuitry with existing commercial components.

Various other time-based digital transmission technologies may be utilized between a voltage sensor (e.g., sensor 900, integrated circuit 1190) and/or a transmitter (e.g., transmitter 910, transmitter 1210) and a receiver (e.g., receiver 930, receivers 1100 receiver 1220) via an LED coupled with a controller (e.g., a portion of sensor 1190) to generate digital communication between such a transmitter and receiver. For example, such communication technologies could include pulse width modulation (PWM) which may be time-based and limited to a single analog value. In another example, such digital communication could be by frequency modulation where a frequency of pulsing carries an analog value. Asynchronous digital communication may pass data (e.g., voltage, status, serial number) with a single LED. Synchronous (i.e., clocked) digital communication utilizes at least a second LED to allow a clocking of data (e.g., voltage, status, serial number). Various types of information may be transmitted from a sensor, and received by a receiver coupled to a controller, via digital communication technologies, as described above. Voltages or other information (e.g., temperature, impedance, gas concentrations, part numbers, or quality control information such as a lot number, supplier, and other manufacturing information) may also be transmitted from an integrated circuit on a fuel cell stack sending voltages to receivers remote from such fuel cell stacks, or remote from particular portions of such fuel cell stacks, via inductive transmitter and receiver coils, RF transmitters and receivers, NFC transmitters and receivers, Bluetooth transmitters and receivers, Wi-Fi transmitters and receivers, or other such wireless technologies. FIG. 18 depicts an example of an inductive transmitter coil 1150 and an inductive receiver coil 1160 which may be utilized for such purpose.

In another example, a transmitter (e.g., transmitter 910, transmitter 1210) for transmitting information about a fuel cell remote from the fuel cell could be a low voltage incandescent bulb or a liquid crystal configured to emit an amount of light or brightness based on an amount of voltage or other parameter detected by a sensor (e.g., sensor 900, integrated circuit 1190), and a receiver (e.g., receiver 930, receivers 1100, receiver 1220) may be configured to monitor such brightness corresponding to the amount of the voltage or other such information. A receiver (e.g., receiver 930, receivers 1100, receiver 1220) could be Si photodiode arrays for detecting a location or other information from an illuminated LED, for example. Further, the above described transmitters and receivers could be located within a fuel cell housing holding a fuel cell stack (e.g., fuel cell stack 20) or such transmitters could be located within the fuel cell stack and the transmitters could be located remote from the stack but within a range and otherwise located (e.g., within a line of sight for optical transmission) to allow allowing wireless transmission of information therebetween.

In an example not depicted, tabs (e.g., tab 340, tab 510) could have outermost edges or lateral edges which may be conductive (e.g., conductive material, such as metal, may be printed or otherwise deposited thereon) and connected to traces (e.g., traces 205, 208, 208, 310, 560) such as those described above which may connect to interior aspects of a fuel cell stack (e.g., fuel cell stack 20). Such conductive tabs may be vertically aligned to allow electrical connections therebetween tabs to allow electrical connection between vertical or lateral portions of a fuel cell stack (e.g., fuel cell stack) to facilitate the connection of sensors and/or controllers to such various portions of a stack as described above.

Fuel cell subassembly 100 may be manufactured using a method based on using a web or plastic sheet which connects components of a fuel cell stack (e.g., fuel cell stack 20) during its manufacture as described in co-owned U.S. patent application Ser. No. 17/572,679 filed Jan. 11, 2022. Alternatively, the manufacture of assembly 100 and portions thereof may be performed manually or a combination of such automated and manual methods.

Although the above-described examples of conductive traces (e.g., trace 200, trace 205, trace 207, trace 208, trace 310, trace 560) refer to such traces being printed, deposited or otherwise located on, connected to, or adjacent, plate separator 110, GDL 122 and membrane 140, the methods of connection of such traces may be utilized with other plate separators, GDLs and systems described herein. For example, such traces may be located on other subgaskets connected to MEAs in multiple fuel cells in a fuel cell stack (e.g., fuel cell stack 20).

While several aspects of the present invention have been described and depicted herein, alternative aspects may be affected by those skilled in the art to accomplish the same objectives. Accordingly, it is intended by the appended claims to cover all such alternative aspects as being within the true spirit and scope of the invention.

The invention claimed is:

1. A fuel cell system comprising:
a membrane electrode assembly;
a first plate separator and a second plate separator on opposite sides of said membrane electrode assembly;
a voltage sensor for detecting a cell voltage relative to opposite sides of said membrane electrode assembly;
a transmitter coupled to said sensor and configured to wirelessly transmit an indication of the cell voltage, wherein the indication comprises an emission of light by said transmitter.

2. The system of claim 1 wherein the indication comprises an emission of light by said transmitter when the cell voltage is greater than a predefined voltage minimum.

3. The system of claim 1 wherein said voltage sensor is electrically connected to said first plate separator and said second plate separator, said first plate separator and said second plate separator comprising bipolar fuel cell plates.

4. The system of claim 1 further comprising a plurality of fuel cells, and wherein a first fuel cell of said plurality of fuel cells comprises said first plate separator, said second plate separator and said membrane electrode assembly.

5. The system of claim 4 wherein said voltage sensor is electrically connected to a second fuel cell of said plurality of fuel cells, and the voltage sensor is configured to detect the cell voltage relative to a first side of said membrane electrode assembly and a second side of a second membrane electrode assembly of the second fuel cell.

6. The system of claim 5 wherein the transmitter is configured to transmit information relative to a location of the first fuel cell of the plurality of fuel cells.

7. The system of claim 5 further comprising a third fuel cell between the first fuel cell and the second fuel cell.

8. The system of claim 1 wherein the transmitter comprises an LED.

9. The system of claim 1 wherein the transmitter transmits the indication via digital communication.

10. The system of claim 1 wherein the transmitter transmits the indication and a location of the first plate separator and/or the second plate separator via digital communication.

11. The system of claim 1 wherein the transmitter comprises an LED transmitting the indication via light emitted by the LED using digital communication.

12. The system of claim 1 wherein the transmitter transmits the indication by emitting light at a predefined brightness based on the voltage.

13. The system of claim 1 further comprising a receiver spaced from the transmitter and configured to wirelessly receive the indication from the transmitter.

14. A method for use in monitoring a fuel cell comprising:
a voltage sensor detecting a cell voltage relative to opposite sides of a membrane electrode assembly of a fuel cell;
a transmitter coupled to said sensor and receiving an indication of the cell voltage from the voltage sensor; and
the transmitter wirelessly transmitting an indication of the cell voltage wherein the transmitting the indication comprises the transmitter emitting light to transmit the indication.

15. The method of claim 14.

16. The method of claim 14 wherein the transmitting the indication comprises the transmitter emitting light when the cell voltage is greater than a predefined voltage minimum.

17. The method of claim 14 wherein the fuel cell is a first fuel cell of a plurality of fuel cells and the detecting the cell voltage comprises detecting the cell voltage of relative to the first fuel cell and a second fuel cell of the plurality of fuel cells.

18. The method of claim 14 wherein the transmitter transmits the indication via digital communication.

19. The method of claim 17 further comprising a receiver spaced from the transmitter and wirelessly receiving the indication.

20. The method of claim 14 further comprising a receiver spaced from the transmitter and wirelessly receiving the indication.

21. A fuel cell system comprising:
a membrane electrode assembly;
a first plate separator and a second plate separator on opposite sides of said membrane electrode assembly;
a voltage sensor for detecting a cell voltage relative top opposite ideas of said membrane electrode assembly,
a transmitter coupled to said sensor and configured to wirelessly transmit an indication of the cell voltage, and
wherein said voltage sensor is electrically connected to said first plate separator and said second plate separator, said first separator and said second plate separator comprising bipolar fuel cell plates.

22. A fuel cell system comprising,
a membrane electrode assembly;
a first plate separator and a second plate separator on opposites ides of said membrane electrode assembly;
a voltage sensor for detecting a cell voltage relative to opposite sides of said membrane electrode assembly;
a transmitter coupled to said sensor and configured to wirelessly transmit an indication of the cell voltage via digital communications.

23. The system of claim 1 wherein the transmitter is configured to transmit a location of the first plate separator and/or the second plate separator via digital communication.

24. A method for use in monitoring a fuel cell comprising:
a voltage sensor detecting a cell voltage relative to opposite sides of a membrane electrode assembly of a fuel cell;
a transmitter coupled to d sensor and receiving an indication of the cell voltage from the voltage sensor; and
the transmitter wirelessly transmitting an indication of the cell voltage, wherein the transmitting the indication comprises the transmitter emitting light when the cell voltage is greater than predefined voltage minimum.

25. A method for use in monitoring a fuel cell comprising:
a voltage sensor detecting a cell voltage relative to opposite sides of a membrane electrode assembly of a fuel cell;
a transmitter coupled to said sensor and receiving an medication of the cell voltage from the voltage sensor; and
the transmitter wirelessly transmitting a of the cell voltage via digital communication.

* * * * *

UNITED STATES PATENT AND TRADEMARK OFFICE
CERTIFICATE OF CORRECTION

| | | |
|---|---|---|
| PATENT NO. | : 12,424,640 B2 | Page 1 of 1 |
| APPLICATION NO. | : 17/817400 | |
| DATED | : September 23, 2025 | |
| INVENTOR(S) | : Jon Owejan et al. | |

It is certified that error appears in the above-identified patent and that said Letters Patent is hereby corrected as shown below:

In the Claims

Column 12, Line 48: Claim 21, Delete "top" and insert -- to --

Column 13, Line 5: Claim 24, Delete "d" and insert -- said --

Signed and Sealed this
Eighteenth Day of November, 2025

John A. Squires
*Director of the United States Patent and Trademark Office*